(12) United States Patent
Chang

(10) Patent No.: US 9,689,896 B2
(45) Date of Patent: Jun. 27, 2017

(54) SEPARATING DEVICE FOR ELECTRONIC COMPONENTS

(71) Applicant: LITE-ON TECHNOLOGY CORP., Taipei (TW)

(72) Inventor: Hao-Chin Chang, Taipei (TW)

(73) Assignees: Lite-On Electronics (Guangzhou) Limited, Guangzhou (CN); Lite-On Technology Corp., Taipei (TW)

( * ) Notice: Subject to any disclaimer, the term of this patent is extended or adjusted under 35 U.S.C. 154(b) by 0 days.

(21) Appl. No.: 15/003,947

(22) Filed: Jan. 22, 2016

(65) Prior Publication Data

US 2016/0318717 A1  Nov. 3, 2016

(30) Foreign Application Priority Data

Apr. 30, 2015 (TW) .............................. 104206604 U

(51) Int. Cl.
*B65B 21/02* (2006.01)
*G01R 1/04* (2006.01)
*H05K 13/02* (2006.01)

(52) U.S. Cl.
CPC ......... *G01R 1/0416* (2013.01); *H05K 13/021* (2013.01)

(58) Field of Classification Search
USPC ......... 414/416.01, 403, 416.05, 749.4, 749.5
See application file for complete search history.

(56) References Cited

U.S. PATENT DOCUMENTS

| 6,409,453 B1 * | 6/2002 | Brodine | ............ H01L 21/67742 |
| | | | 414/416.01 |
| 2010/0080675 A1 * | 4/2010 | Monteiro | ............... B65G 25/02 |
| | | | 414/225.01 |
| 2013/0230375 A1 * | 9/2013 | Tung | ................. H01L 21/67706 |
| | | | 414/592 |

* cited by examiner

*Primary Examiner* — Saul Rodriguez
*Assistant Examiner* — Willie Berry, Jr.
(74) *Attorney, Agent, or Firm* — Rosenberg, Klein & Lee

(57) ABSTRACT

A separating device includes a base, a feed mechanism operable to convey first and second electronic component to a discharge end thereof, and a separating mechanism disposed on the base and including a first carrier connected slidably to the base and configured to carry the first electronic component, a second carrier connected slidably to the base and configured to carry the second electronic component, and a drive unit for driving reciprocation of the first and second carriers between a pick-up position, where the first carrier abuts against the second carrier, and a separating position, where the first and second carriers are separated from each other.

6 Claims, 8 Drawing Sheets

SEPARATING DEVICE FOR ELECTRONIC COMPONENTS

CROSS REFERENCE TO RELATED APPLICATION

This application claims priority of Taiwanese Application No. 104206604, filed on Apr. 30, 2015.

FIELD

The disclosure relates to a separating device, more particularly to a separating device for picking up and separating a plurality of adjacent electronic components.

BACKGROUND

An existing electronic component separating device comprises a feed mechanism and a separating mechanism. The feed mechanism delivers an electronic component to the separating mechanism, after which a pick-up device picks up and takes away the electronic component for subsequent testing of the electronic component.

However, the separating mechanism of the existing separating device has only one carrier for carrying one electronic component at a time. Hence, there is still room for improving the separating efficiency of the existing separating device.

SUMMARY

Therefore, an object of this disclosure is to provide a separating device for electronic components in which the separating efficiency thereof is improved.

According to one aspect of this disclosure, a separating device for electronic components comprises a base, a feed mechanism and a separating mechanism. The feed mechanism includes a discharge end, and is operable to convey a first electronic component and a second electronic component to the discharge end. The separating mechanism is disposed on the base and includes a first carrier connected slidably to the base and configured to carry the first electronic component, a second carrier connected slidably to the base and configured to carry the second electronic component, and a drive unit for driving reciprocation of the first and second carriers between a pick-up position, where the first carrier abuts against the second carrier, and a separating position, where the first and second carriers are separated from each other.

According to another aspect of this disclosure, a separating device for electronic components comprises a feed mechanism and a separating mechanism. The feed mechanism includes a discharge end, and is operable to convey a first electronic component and a second electronic component to the discharge end. The separating mechanism is configured to receive the first and second electronic components from the discharge end, and includes a first carrier configured to carry the first electronic component, a second carrier configured to carry the second electronic component, and a drive unit for driving the first and second carriers to a separating position, where the first and second carriers are separated from each other.

The efficiency of the disclosure resides in that, through the drive unit of the separating mechanism, the first and second carriers can be driven to move between the pick-up position and the separating position. At the pick-up position, the feed mechanism conveys two electronic components to the abutted first and second carriers. At the separating position, the first and second carriers are separated from each other, and a pick-up device can be activated to pick-up and take away the two electronic components 4 carried by the first and second carrier seats. Hence, the effect of separating and taking away two electronic components at one time can be achieved.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
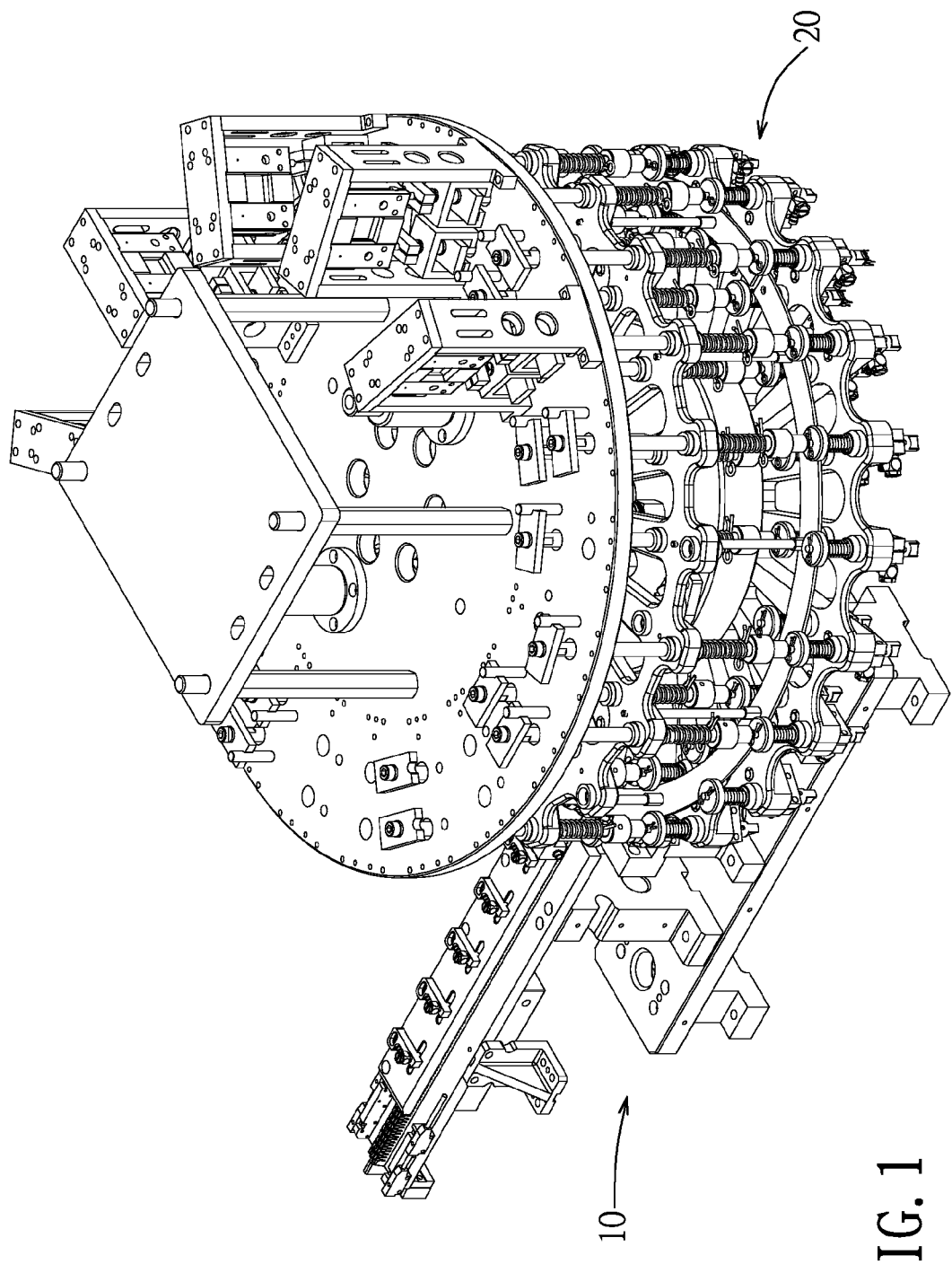
FIG. 1 is a perspective view, illustrating a separating device according to the embodiment of the disclosure cooperating with a pick-up device.
Figure 2:
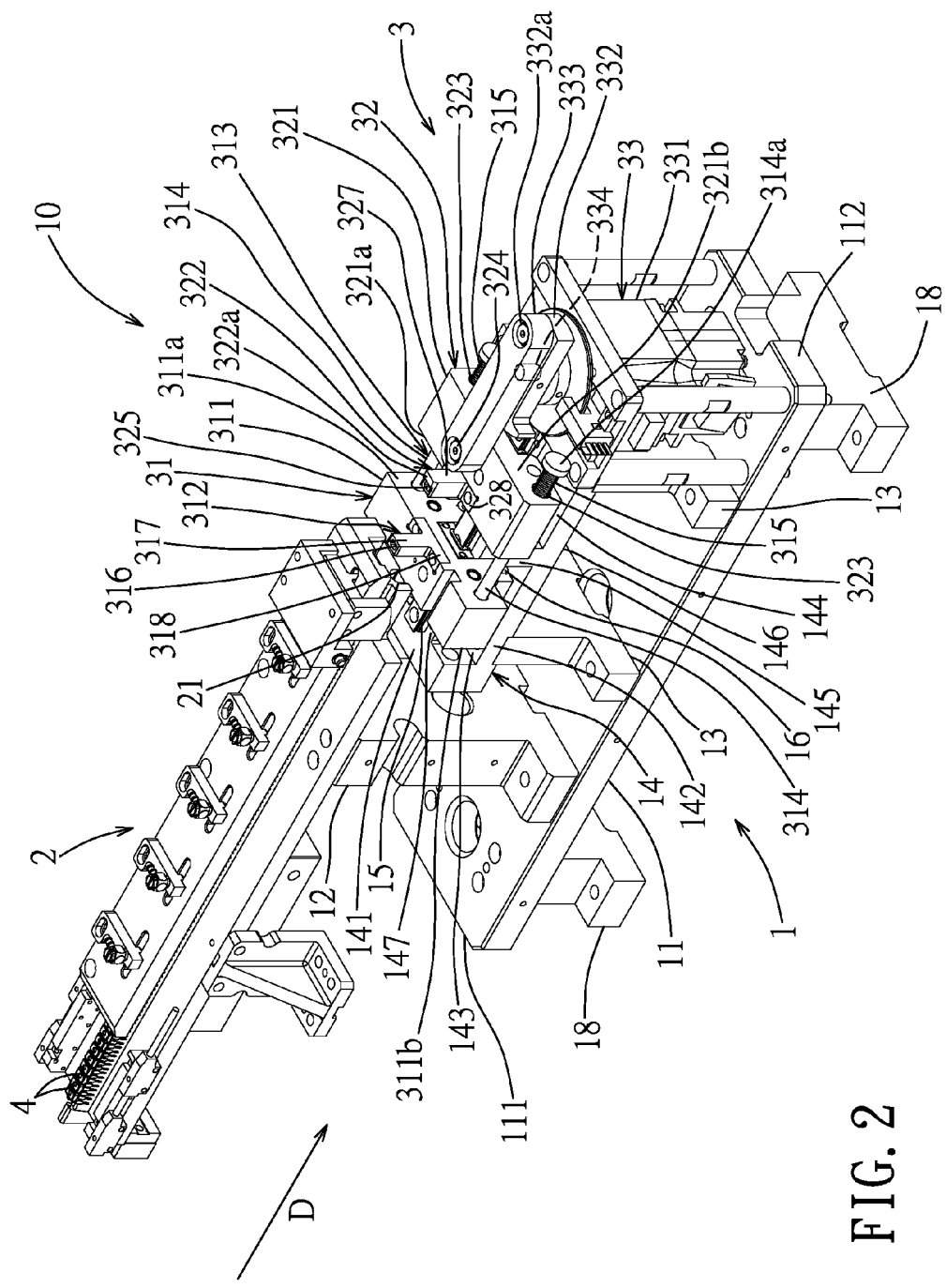
FIG. 2 is an enlarged perspective view of the embodiment of the separating device.

Referring to FIGS. 1 and 2, a separating device 10 according to the embodiment of the disclosure is shown to cooperate with a pick-up device 20 during operation. The separating device 10 comprises a base 1, a feed mechanism 2 and a separating mechanism 3.

The base 1 includes a base platform 11, a first support member 12, two second support members 13, a carrier platform 14, a slide rail 15 and two spring-loaded stopping members 16. The base platform 11 is supported on a planar surface, such as a ground, by two spaced-apart legs 18, and has a front end 111 and a rear end 112 opposite to the front end 111. The first support member 12 is mounted on the platform 11 in proximity to the front end 111 thereof. The second support members 13 are mounted on the platform 11 rearwardly of the first support member 12, and are spaced apart from each other in a front-rear direction. The first support member 12 has a height higher than that of each second support member 13.

The carrier platform 14 is mounted on and supported by top ends of the second support members 13, and has a top surface 141, a bottom surface 146, two lateral surfaces 142 (only one is visible in FIG. 2) connected between the top and bottom surfaces 141, 146, two first notches 143, and two second notches 144. The first notches 143 extend downwardly from the top surface 141, inwardly from the respective lateral surfaces 142 and terminating upwardly of the bottom surface 146. The first notches 143 do not communicate with each other, and are proximate to the feed mechanism 2. The second notches 144 extend downwardly from the top surface 141, inwardly from the respective lateral surfaces 142 and terminating upwardly of the bottom surface 146. The second notches 144 do not communicate with each other, and are respectively disposed spacedly rearwardly of the first notches 143. That is, the second notches 144 are distal from the feed mechanism 2. Moreover, the second notches 144 do not communicate with the first notches 143.

The carrier platform 14 is notched such that a first divider 147 and a second divider 145 are formed. The first divider 147 is formed between the first notches 143 and between the second notches 144, and extends in the front-rear direction. The second divider 145 is formed between the first and second notches 143, 144, extends in a left-right direction which is transverse to the front-rear direction, and intersects the first divider 147. Each of the spring-loaded stopping members 16 extends through and is disposed on the second divider 145 such that one end thereof is located in one of the first notches 143 and the other end thereof is located in a corresponding one of the second notches 144. The slide rail 15 is mounted on the first divider 147 between the first notches 143 and between the second notches 144. The number of the spring-loaded stopping members 16 is not limited to two, and may be one in an alternative embodiment.

The feed mechanism 2 is mounted on and supported by the first support member 12, and includes a discharge end 21. The feed mechanism 2 is movable along a conveying direction (D), which is a front-to-rear direction, for conveying a plurality of electronic components 4 to the discharge end 21. The electronic components 4 are arranged side by side along the conveying direction (D). The base platform 11 extends along the conveying direction (D).

Figure 3:
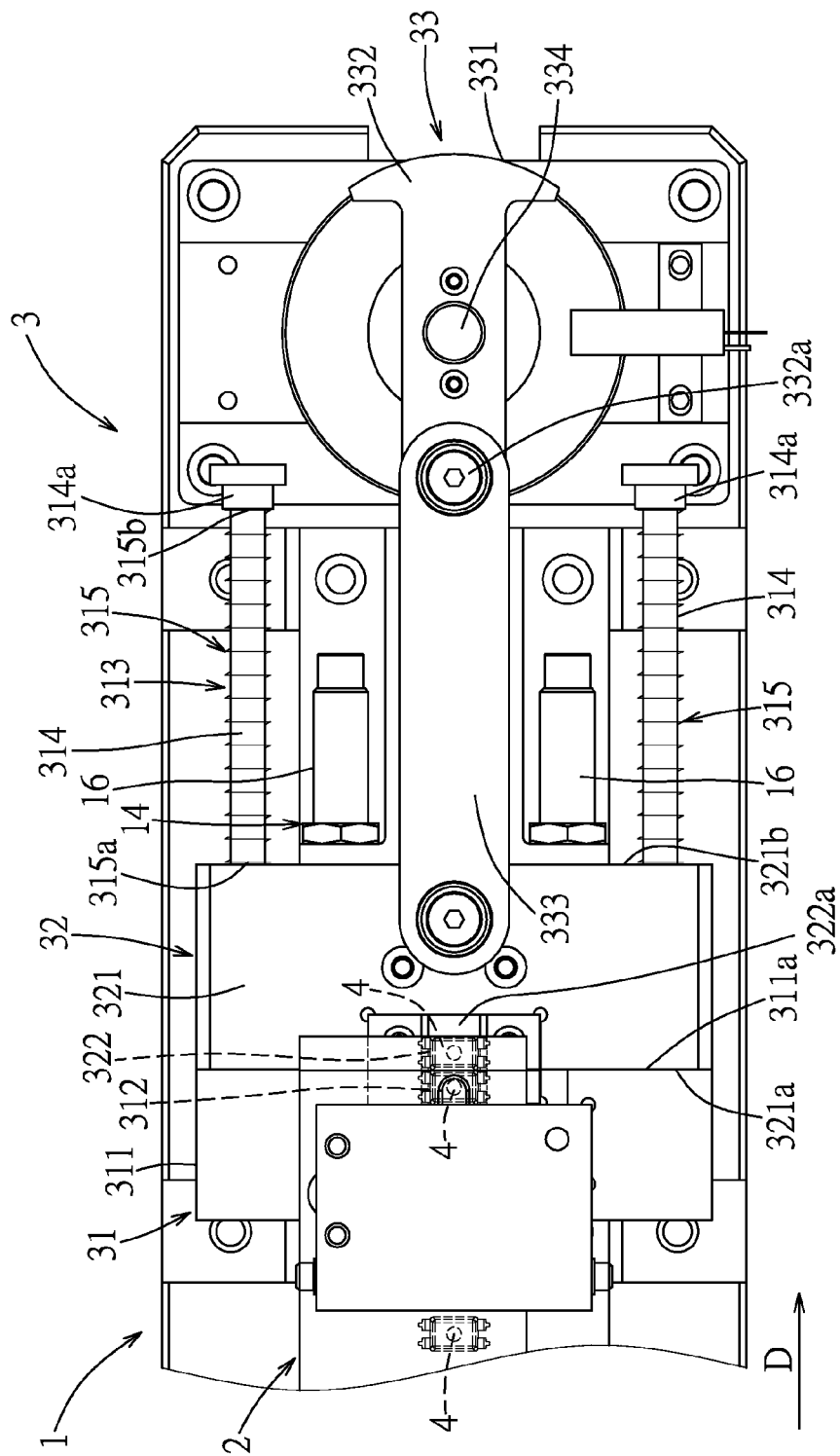
FIG. 3 is a fragmentary top view for illustrating a first carrier and a second carrier of the embodiment disposed at a pick-up position.

With reference to FIGS. 2 and 3, the separating mechanism 3 includes a first carrier 31, a second carrier 32, a pushing assembly 313 and a drive unit 33. The first carrier 31 is proximate to the discharge end 21 for carrying one of the electronic components 4, and includes a first slide block 311 and a first carrier seat 312. The first slide block 311 is connected slidably to the slide rail 15, and has a substantially inverted U-shaped body including a bight portion, left and right arms extending from left and right ends of the bight portion into the first notches 143, respectively, a first abutment surface ($311a$) facing the second carrier 32, and a second abutment surface ($311b$) opposite to the first abutment surface ($311a$) and facing the discharge end 21. The first carrier seat 312 is mounted on and extends upwardly from a top surface of the bight portion of the first slide block 311 immediately adjacent to the first abutment surface ($311a$) for carrying the one of the electronic components 4. In this embodiment, the first carrier seat 312 has an inverted T-shaped cross section including a horizontal column 318 secured to the top surface of the bight portion of the first slide block 311, a square-shaped vertical column 317 extending upwardly and transversely from the horizontal column 318, and an air hole 316 extending through the horizontal and vertical columns 318, 317.

The second carrier 32 is located rearwardly of the first carrier 31 and is distal from the discharge end 21 for carrying another one of the electronic components 4. The second carrier 32 includes a second slide block 321 and a second carrier seat 322. The second slide block 321 is connected slidably to the slide rail 15, and has a first abutment surface ($321a$), and a second abutment surface ($321b$) opposite to the first abutment surface ($321a$). The second slide block 321 is formed with two through holes 323 that extend through the first and second abutment surfaces ($321a$, $321b$) and that are spaced apart from each other in the left-right direction. The second carrier seat 322 is mounted on and extends upwardly from a top surface of the second slide block 321 immediately adjacent to the first abutment surface ($321a$) for carrying the another one of the electronic components 4, and corresponds in position to the first carrier seat 312. In this embodiment, the second carrier seat 322 has an inverted T-shaped cross section including a horizontal column 328 secured to the top surface of the second slide block 321, a vertical column 327 extending upwardly and transversely from the horizontal column 328, a stopping protrusion ($322a$) protruding from a top end of the vertical column 327, and an air hole 325 extending through the horizontal and vertical columns 328, 327.

In this embodiment, the pushing assembly 313 includes two connecting rods 314 and two resilient members in the form of compression springs 315. Each of the connecting rods 314 has one end connected to the first abutment surface ($311a$), and another end opposite to the one end and extending through a respective one of the through holes 323 along the conveying direction (D). The another end of each connecting rod 314 terminates with a flange ($314a$). Each of the compression springs 315 is sleeved on a respective one of the connecting rods 314, and has a first end ($315a$) abutting against the second abutment surface ($321b$), and a second end ($315b$) opposite to the first end ($315a$) and abutting against the flange ($314a$) of the respective connecting rod 314.

Figure 5:
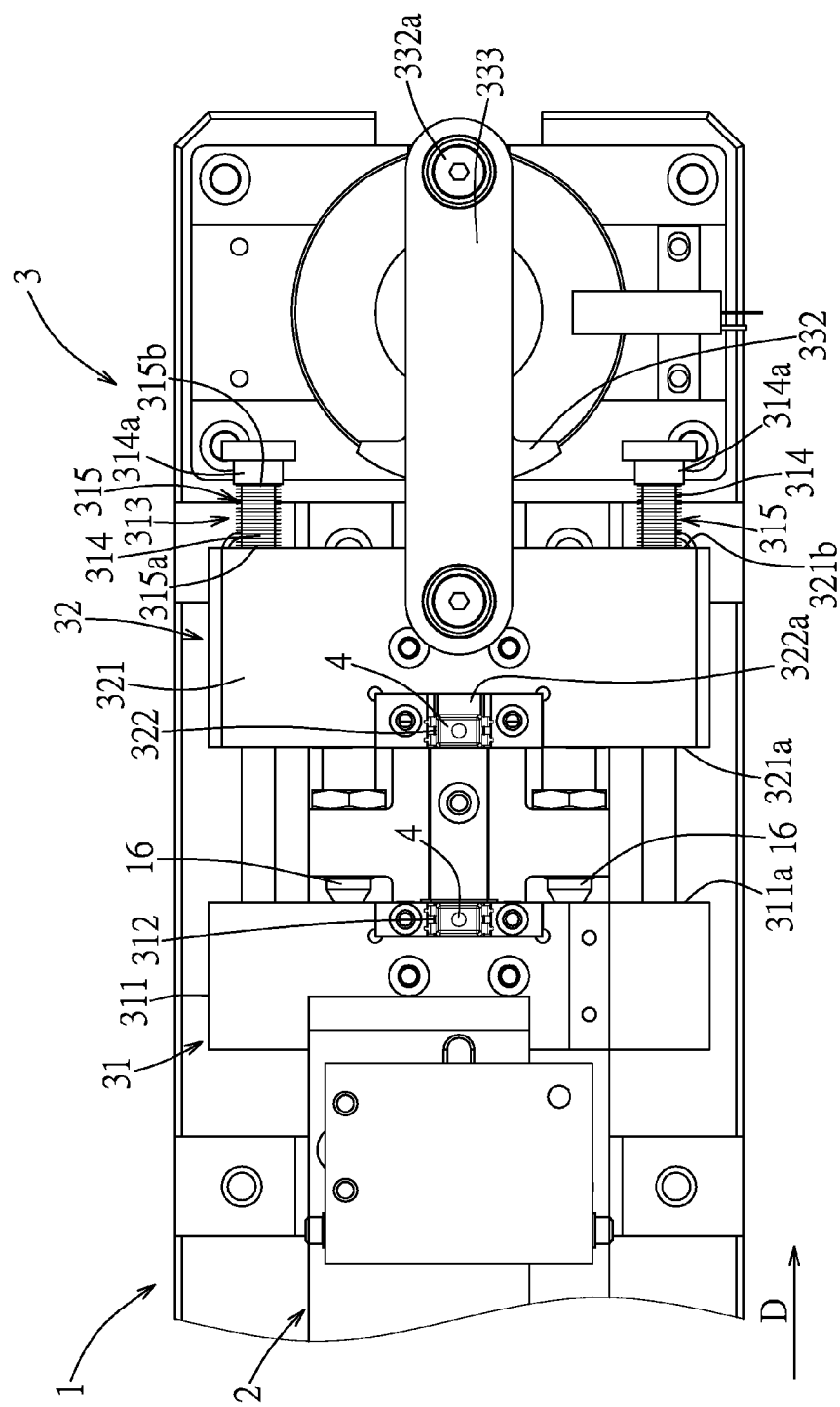
FIG. 5 is a view similar to FIG. 3, but illustrating the first and second carriers at the separating position.

The drive unit 33 is connected to the second slide block 321, is proximate to the second notches 144, and is used for driving reciprocation of the first and second carriers 31, 32 between a pick-up position, as shown in FIG. 3, and a separating position, as shown in FIG. 5. In the pick-up position, the first and second carriers 31, 32 abut against each other, and the first carrier 31 also abuts against the discharge end 21 of the feed mechanism 2. In the separating position, the first and second carriers 31, 32 are separated from each other, and the first carrier 31 is disposed away from the discharge end 21. The discharge end 21 and the stopping members 16 are used to restrict movement of the first carrier seat 312 along the slide rail 15 within the region of the first notches 143 so as to prevent the first slide block 311 from escaping from the slide rail 15.

Furthermore, the drive unit 33 includes a driving motor 331 mounted on the base platform 11 and having a rotary shaft 334, a rotary member 332, and a swing lever 333. The rotary member 332 has a center fixed to the rotary shaft 334 so that the rotary member 332 rotates along with the rotary shaft 334. The rotary member 332 has a shaft portion ($332a$) spaced apart from and parallel to the rotary shaft 334. The swing lever 333 has two opposite ends rotatably pivoted to the shaft portion ($332a$) and a shaft portion 324 of the second slide block 321, respectively.

Referring again to FIG. 3, at the pick-up position, the first carrier seat 312 abuts against the discharge end 21 (see FIG. 2) of the feed mechanism 2, and the second carrier seat 322 abuts against the first carrier seat 312. That is, the second abutment surface ($311b$) (see FIG. 2) of the first slide block 311 abuts against the discharge end 21, and the first abutment surface ($321a$) of the second slide block 321 abuts against the first abutment surface ($311a$) of the first slide block 311. Further, the spring-loaded stopping members 16 and the compression springs 315 are all in an uncompressed state, and the shaft portion ($332a$) of the rotary member 332 is disposed forwardly of the rotary shaft 334. At this moment, the feed mechanism 2 is operated to move along the conveying direction (D) and push two electronic components 4 to the abutted first and second carrier seats 312, 322. Through the stopping protrusion (322a) of the second carrier seat 322 that blocks a leading one of the electronic components 4 from further movement along the conveying direction (D), two electronic components 4 can be accurately and respectively disposed on the first and second carrier seats 312, 322. After the two electronic components 4 are pushed to the respective first and second carrier seats 312, 322, the air holes 316, 325 of the first and second carrier seats 312, 322 are vacuumed to suck the respective electronic components 4, thereby stably positioning the two electronic components 4 on the respective first and second carrier seats 312, 322.

Figure 4:
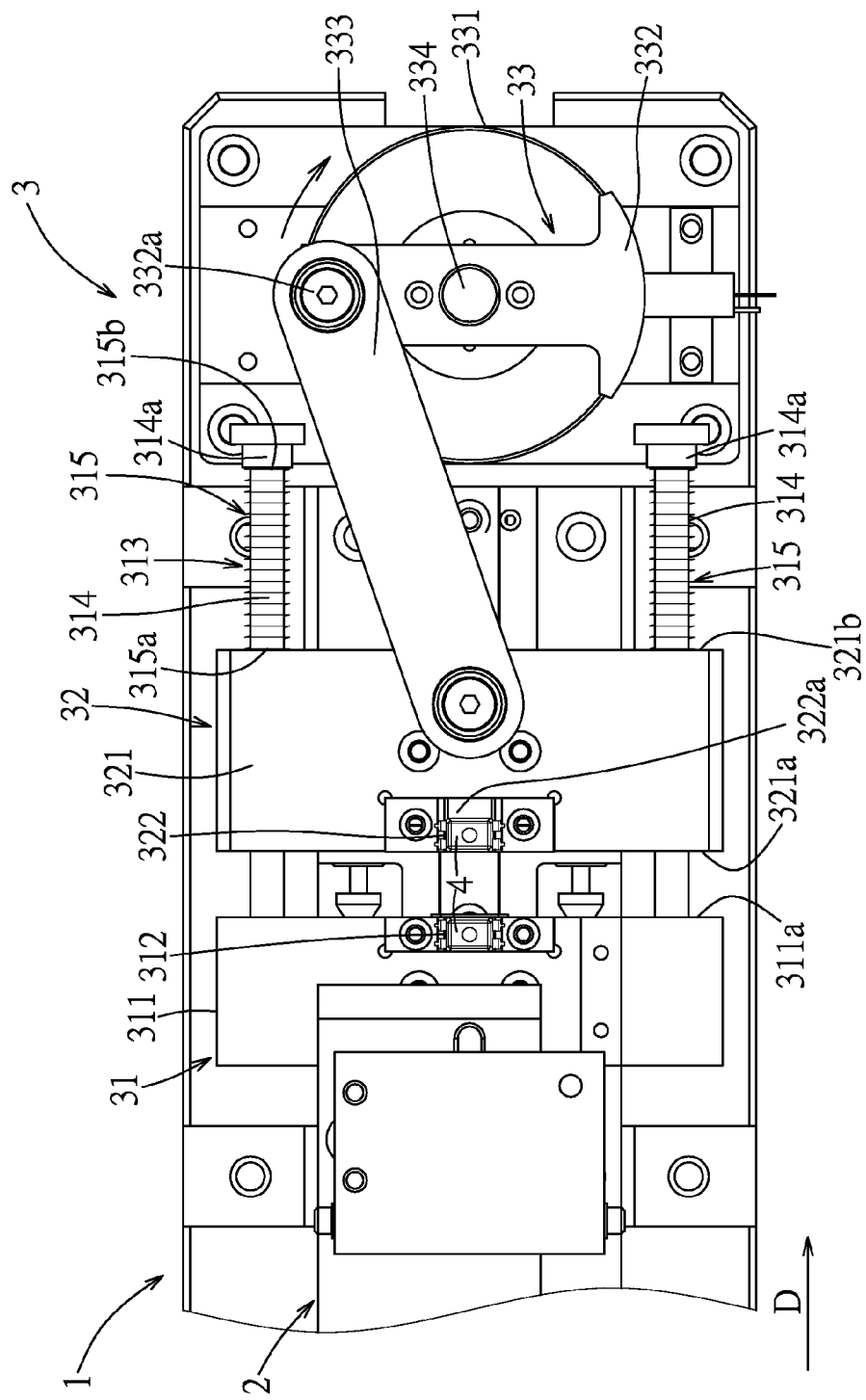
FIG. 4 is a view similar to FIG. 3, but illustrating the first and second carriers being moved from the pick-up position to a separating position.

As shown in FIG. 4, the driving motor 331 is then activated to drive the shaft portion (332a) of the rotary member 332 to rotate along an arrow in a clockwise direction. The shaft portion (332a), in turn, drives the swing lever 333 to rotate therealong, and the second slide block 321 is pulled by the swing lever 333 to gradually move away from the first slide block 311 along the conveying direction (D) so as to separate the first and second slide blocks 311, 321.

Referring to FIG. 5, in combination with FIG. 4, as the driving motor 331 continues to drive the shaft portion (332a) of the rotary member 332 to rotate clockwise, the second slide block 321 is also continuously pulled by the swing lever 333 to move along the conveying direction (D) until the second abutment surface (321b) of the second slide block 321 presses the compression springs 315 against the respective flanges (314a) of the connecting rods 314. The second ends (315b) of the compression springs 315, in turn, will push the flanges (314a) of the connecting rods 314 to move the connecting rods 314 and the first carrier 31 away from the discharge end 21 along the conveying direction (D). When the first abutment surface (311a) of the first carrier 31 pushes and compresses the spring-loaded stopping members 16, the first carrier is stopped by the stopping members 16 from continuously moving along the conveying direction (D). Simultaneously, the swing lever 333 will continue to drive movement of the second slide block 321 along the conveying direction (D) so as to widen the distance between the first and second carriers 31, 32. When the shaft portion (332a) of the rotary member 332 is rotated to the position shown in FIG. 5, the driving motor 331 stops driving the rotation of the rotary member 332. At this time, the first and second carriers 31, 32 are disposed at the separating position, and air is filled into the air holes 316, 325 of the first and second carrier seats 312, 322, so that the electronic components 4 are no longer sucked by the first and second carrier seats 312, 322.

Figure 6:
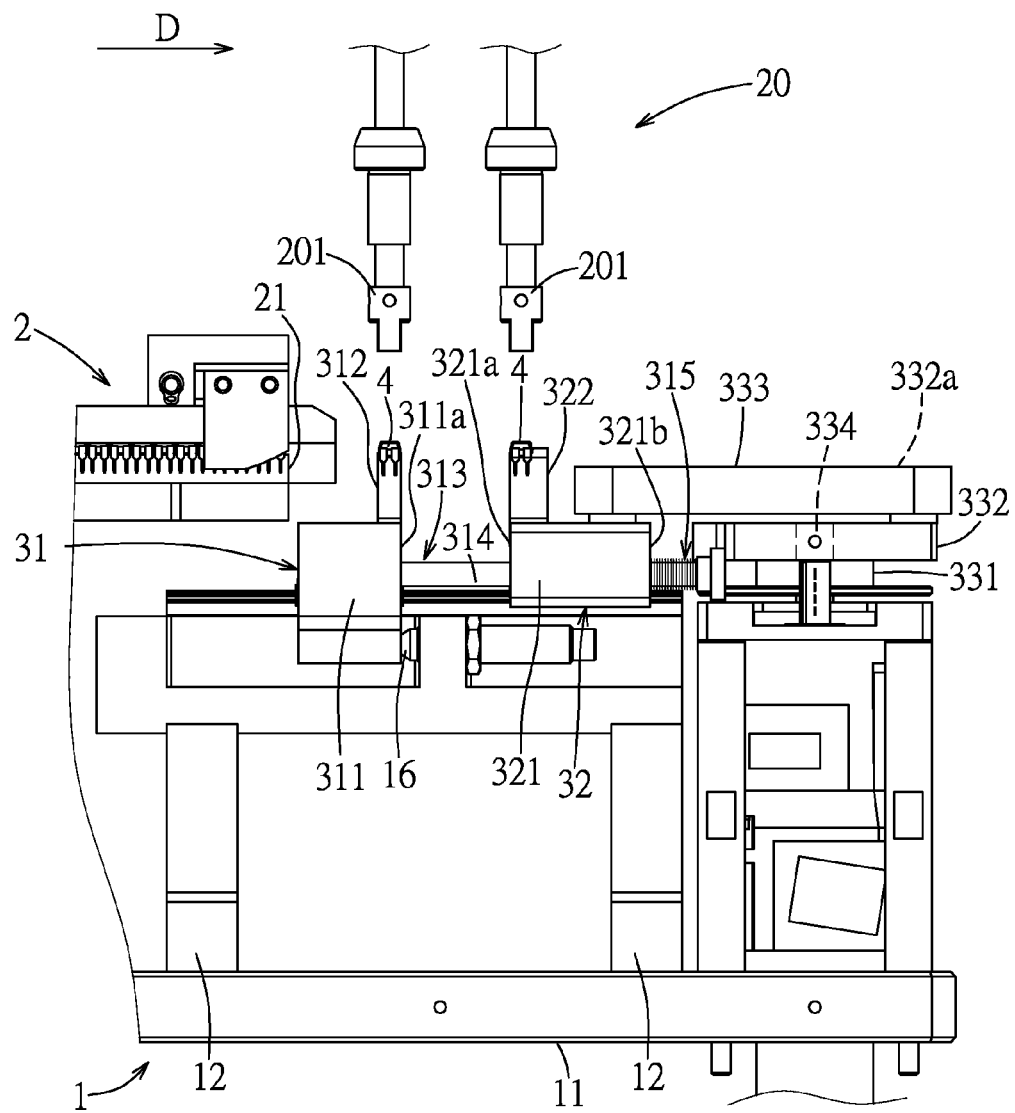
FIG. 6 is a fragmentary schematic side view of the embodiment, illustrating the first and second carriers at the separating position.
Figure 7:
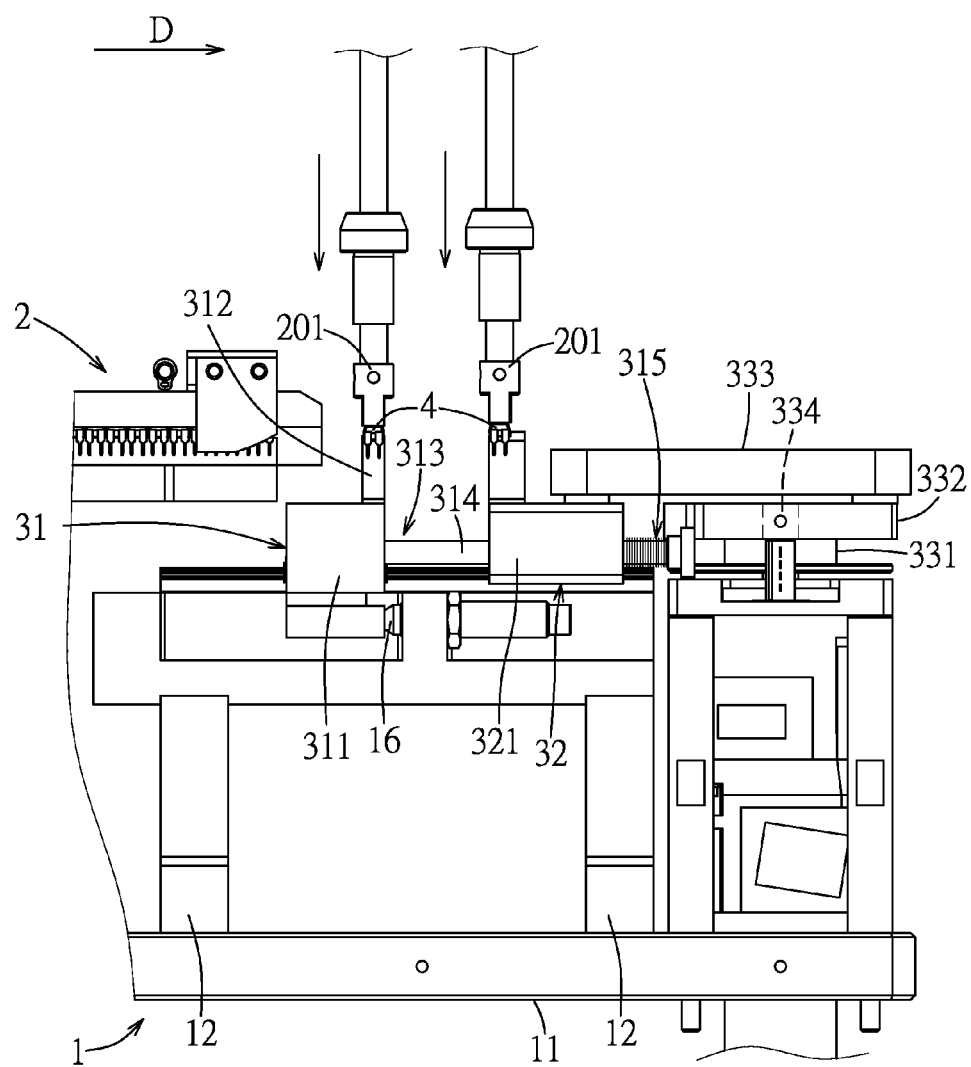
FIG. 7 is a view similar to FIG. 6, but illustrating two pick-up members of the pick-up device respectively picking up two electronic components carried by the first and second carriers.
Figure 8:
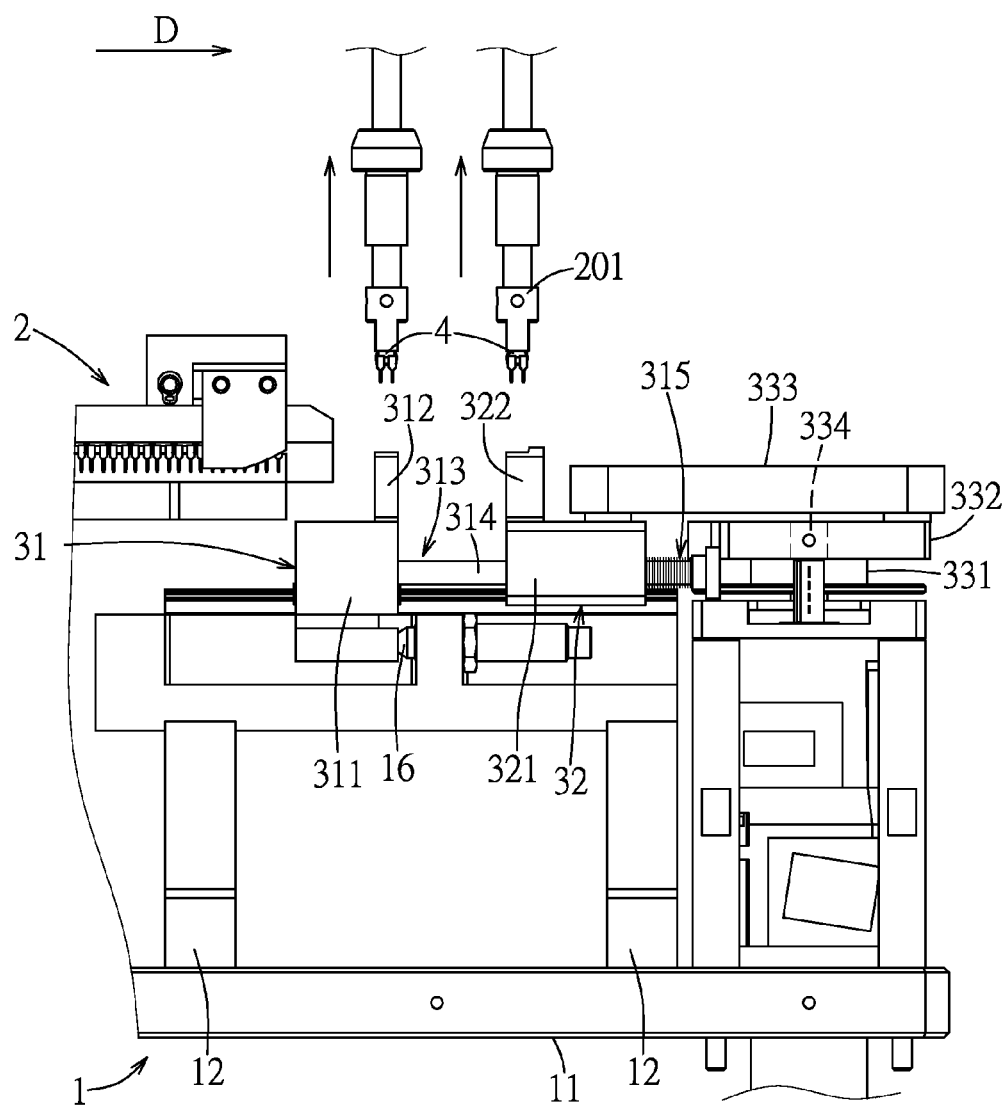
FIG. 8 is a view similar to FIG. 7, but illustrating the pick-up members respectively taking away the electronic components.

Referring to FIGS. 6 to 8, at the separating position, two pick-up members 201 of the pick-up device 20 are operated to respectively align first with the electronic components 4 carried by the first and second carrier seats 312, 322, after which they are moved down simultaneously and synchronously to pick-up and take away the electronic components 4. The structure of each of the pick-up members 201 is similar to that of each of the first and second carrier seats 312, 322, and uses the same means to suck and pick-up the respective electronic component 4. Since the means for sucking the electronic components 4 by the first and second carrier seats 312, 322 and the pick-up members 201 is conventional and is well known in the art, a detailed description thereof is dispensed with herein.

After the two pick-up members 201 take away the electronic components 4 from the first and second carrier seats 312, 322, the driving motor 331 is reactivated to drive the shaft portion (332a) of the rotary member 332 to rotate clockwise so as to move the first and second carriers 31, 32 back to the pick-up position, so that the first and second carriers 31, 32 can continue to carry another two of the electronic components 4 for the separating operation.

In sum, through the drive unit 33 of the separating mechanism 3, the first and second carriers 31, 32 can be driven to move between the pick-up position and the separating position. At the pick-up position, the feed mechanism 2 conveys two electronic components 4 to the abutted first and second carriers 31, 32. With the activation of the driving motor 331 of the drive unit 33, the shaft portion (332a) of the rotary member 332 is driven to rotate along with the rotary shaft 334. As the shaft portion (332a) rotates, it drives the swing lever 333 to rotate therealong so that the swing lever 333 can pull and move the first and second carriers 31, to the separating position. At the separating position, the first and second carriers 31, 32 are separated from each other, and the pick-up members 201 of the pick-up device 20 are activated to pick-up and take away the two electronic components 4 carried by the first and second carrier seats 312, 322. The effect of separating and taking away two electronic components 4 at one time can thus be achieved. Therefore, the object of this disclosure can be realized.

While the disclosure has been described in connection with what is considered the most practical embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A separating device for electronic components, comprising:
   a base;
   a feed mechanism including a discharge end, said feed mechanism being operable to convey a first electronic component and a second electronic component to said discharge end; and
   a separating mechanism disposed on said base and including
      a first carrier connected slidably to said base and configured to carry the first electronic component,
      a second carrier connected slidably to said base and configured to carry the second electronic component, wherein said first and second carriers are configured to respectively carry the first and second electronic components at the same time, and
      a drive unit for driving reciprocation of said first and second carriers between a pick-up position, where said first carrier abuts against said second carrier, and a separating position, where said first and second carriers are separated from each other,
   wherein said feed mechanism is operated to move the first and second electronic components from said discharge end to said first and second carriers, respectively, at the same time,
   wherein said separating mechanism further includes a connecting rod, said second carrier pushing said connecting rod to drive said first carrier to move along with said second carrier,
   wherein said separating mechanism further includes a resilient member sleeved on said connecting rod, said second carrier compressing said resilient member to push said connecting rod and drive said first carrier to move along with said second carrier.

2. The separating device as claimed in claim 1, wherein said drive unit includes a swing lever connected to said second carrier for driving movement of said second carrier on said base.

3. The separating device as claimed in claim 1, wherein, when said second carrier is moved a distance away from said first carrier, said second carrier pushes said connecting rod to drive said first carrier to move along with said second carrier.

4. A separating device for electronic components, comprising:
   a feed mechanism including a discharge end, said feed mechanism being operable to convey a first electronic component and a second electronic component to said discharge end; and
   a separating mechanism configured to receive the first and second electronic components from said discharge end, said separating mechanism including
      a first carrier configured to carry the first electronic component,
      a second carrier configured to carry the second electronic component, and
      a drive unit for driving said first and second carriers to a separating position, where said first and second carriers are separated from each other;
   wherein said separating mechanism further includes a connecting rod, and a resilient member sleeved on said connecting rod, said second carrier compressing said resilient member to push said connecting rod and drive said first carrier to move along with said second carrier.

5. The separating device as claimed in claim 4, wherein when said first carrier is moved a distance, said second carrier drives said first carrier to move therealong.

6. The separating device as claimed in claim 4, wherein, in the separating position, said first and second carriers are separated from each other at a predetermined distance for a pick-up device to take away the first and second electronic components respectively carried by said first and second carriers.

\* \* \* \* \*